(12) United States Patent
Wang et al.

(10) Patent No.: US 12,721,169 B2
(45) Date of Patent: Aug. 25, 2026

(54) ELECTRONIC PACKAGE MODULE

(71) Applicant: Acer Incorporated, New Taipei City (TW)

(72) Inventors: Yu-Shih Wang, New Taipei City (TW); Chih-Chun Liu, New Taipei City (TW); Cheng-Nan Ling, New Taipei City (TW); Wen-Chieh Tai, New Taipei City (TW)

(73) Assignee: Acer Incorporated, New Taipei City (TW)

( * ) Notice: Subject to any disclaimer, the term of this patent is extended or adjusted under 35 U.S.C. 154(b) by 384 days.

(21) Appl. No.: 18/479,834

(22) Filed: Oct. 3, 2023

(65) Prior Publication Data

US 2024/0258198 A1 Aug. 1, 2024

(30) Foreign Application Priority Data

Jan. 30, 2023 (TW) ................................ 112102982

(51) Int. Cl.
*H10W 40/70* (2026.01)
*H10W 40/25* (2026.01)
*H10W 40/60* (2026.01)
*H10W 40/20* (2026.01)

(52) U.S. Cl.
CPC ......... *H10W 40/70* (2026.01); *H10W 40/257* (2026.01); *H10W 40/611* (2026.01); *H10W 40/242* (2026.01); *H10W 40/60* (2026.01)

(58) Field of Classification Search
CPC . H01L 23/3733; H01L 23/4006; H01L 23/42; H01L 2023/4068; H01L 2023/4087; H10W 40/242; H10W 40/257; H10W 40/60; H10W 40/611; H10W 40/70
See application file for complete search history.

(56) References Cited

U.S. PATENT DOCUMENTS 5,323,294 A 6/1994 Layton et al.
5,459,352 A * 10/1995 Layton ................ H01L 23/3733 257/E23.09
5,561,590 A 10/1996 Norell et al.
5,572,404 A * 11/1996 Layton .................. H01L 23/433 257/E23.09
6,849,941 B1 * 2/2005 Hill ..................... H01L 23/4275 257/710

(Continued)

FOREIGN PATENT DOCUMENTS

CN 217308103 8/2022
EP 3522212 8/2019

(Continued)

*Primary Examiner* — Robert J Hoffberg
(74) *Attorney, Agent, or Firm* — JCIPRNET

(57) ABSTRACT

The invention provides an electronic package module including a chip, a heat-dissipation component, a carrying member, and a liquid metal. The carrying member is clamped between the chip and the heat-dissipation component. The carrying member has a porous structure. The liquid metal is filled in the porous structure to be in thermal contact with the chip and the heat-dissipation component. The liquid metal is constrained between the chip and the heat-dissipation component by the carrying member and does not flow outside of the chip and the heat-dissipation component.

11 Claims, 3 Drawing Sheets

(56) References Cited

U.S. PATENT DOCUMENTS

| | | | | |
|---|---|---|---|---|
| 7,219,713 | B2 * | 5/2007 | Gelorme | H01L 23/42 165/185 |
| 7,957,147 | B2 * | 6/2011 | Ma | H01L 23/4006 361/717 |
| 8,034,662 | B2 * | 10/2011 | Touzelbaev | H01L 23/42 438/109 |
| 9,263,364 | B2 * | 2/2016 | Touzelbaev | H01L 23/42 |
| 10,856,403 | B2 * | 12/2020 | Manninen | H05K 1/0203 |
| 12,238,897 | B2 * | 2/2025 | Watanabe | H01L 23/3736 |
| 12,300,567 | B2 * | 5/2025 | Berntson | H01L 23/3736 |
| 12,451,402 | B2 * | 10/2025 | Berntson | H01L 23/3675 |
| 12,469,813 | B2 * | 11/2025 | Hashiba | H01L 24/32 |
| 2005/0155752 | A1 * | 7/2005 | Larson | H01L 23/3733 165/185 |
| 2006/0146503 | A1 | 7/2006 | Kubo | |
| 2011/0096507 | A1 * | 4/2011 | Deram | H01L 23/433 228/141.1 |
| 2022/0375816 | A1 | 11/2022 | Berntson et al. | |

FOREIGN PATENT DOCUMENTS

| | | |
|---|---|---|
| JP | 2003332505 | 11/2003 |
| TW | M579819 | 6/2019 |
| TW | M624961 | 4/2022 |
| TW | M630356 | 8/2022 |
| TW | M636084 | 1/2023 |

* cited by examiner

ELECTRONIC PACKAGE MODULE

CROSS-REFERENCE TO RELATED APPLICATION

This application claims the priority benefit of Taiwan application serial no. 112102982, filed on Jan. 30, 2023. The entirety of the above-mentioned patent application is hereby incorporated by reference herein and made a part of this specification.

BACKGROUND

Technical Field

The disclosure relates to an electronic package module.

Description of Related Art

At present, all kinds of common electronic components are researched and designed in the direction of miniaturization. However, due to many factors such as miniaturization and greatly improved performance of various electronic components, it is also easy to generate high heat during actual operation, which affects the overall operating performance. Therefore, it is necessary to use the conventional micro-chamber to dissipate heat. The heat dissipation structure of conventional electronic devices is provided by heat sinks disposed on the electronic components, and then the fan unit is used to guide the airflow to the outside of the casing. However, due to the tight arrangement of the components inside the casing, the heat emitted by the heat source cannot be effectively discharged outside, resulting in a temperature rise effect inside the casing. In addition to the vicious cycle of continuous heat accumulation, if the temperature inside the casing cannot be maintained in a normal range, the reliability and service life of the entire electronic device are affected, and may cause leakage problems and over-temperature problems during over frequency.

Liquid metal is a low-melting-point alloy that is liquid at room temperature, or a solid sheet that becomes liquid when heated to the melting point. The composition is, for example, gallium-indium-tin alloy, indium-bismuth-tin alloy, or indium-bismuth-zinc alloy etc., the characteristics are stable and the thermal conductivity and electrical conductivity are excellent, in which the thermal conductivity and the specific heat capacity are much higher than the traditional silicone grease thermal paste, and may be used as a heat conduction agent between the heat source and heat-dissipation fins to replace the thermal paste above.

However, in practical applications, liquid metal at room temperature has high fluidity (low viscosity), so when being used as a heat transfer medium between a semiconductor chip and a heat sink, it is often necessary to face the overflow problem of liquid metal in the process. That is, when the liquid metal is squeezed by the heat sink and may overflow to the periphery of the semiconductor chip, short circuit damage may easily be caused due to the liquid metal contacting the surrounding electronic components or substrate (circuit).

SUMMARY

The disclosure provides an electronic package module, which effectively constrains the liquid metal between the heat-dissipation component and the chip through the porous structure of the carrying member, so as to maintain the required heat dissipation performance and avoid the short-circuit damage caused by the liquid metal overflow.

The electronic package module of the disclosure includes a chip, a heat-dissipation component, a carrying member, and a liquid metal. The carrying member is clamped between the chip and the heat-dissipation component. The carrying member has a porous structure. The liquid metal is filled in the porous structure to be in thermal contact with the chip and the heat-dissipation component. The liquid metal is constrained between the chip and the heat-dissipation component by the carrying member and does not flow outside of the chip and the heat-dissipation component.

Based on the above, in the above embodiments of the disclosure, the electronic package module effectively constrains the liquid metal between the heat-dissipation component and the chip through the porous structure of the carrying member, so as to maintain the required heat dissipation performance and avoid the short-circuit damage that may be caused by the liquid metal flowing outside of the heat-dissipation component and the chip. Furthermore, the porous structure of the carrying member produces a capillary-like adsorption effect on the liquid metal, so that the liquid metal may be successfully retained in a space between the heat-dissipation component and the chip without overflowing. In this way, the liquid metal may stably and continuously transmit the heat generated by the chip to the heat-dissipation component and then dissipate out of the electronic package module, so that the liquid metal may maintain a proper heat dissipation effect.

DESCRIPTION OF THE EMBODIMENTS

Figure 1:
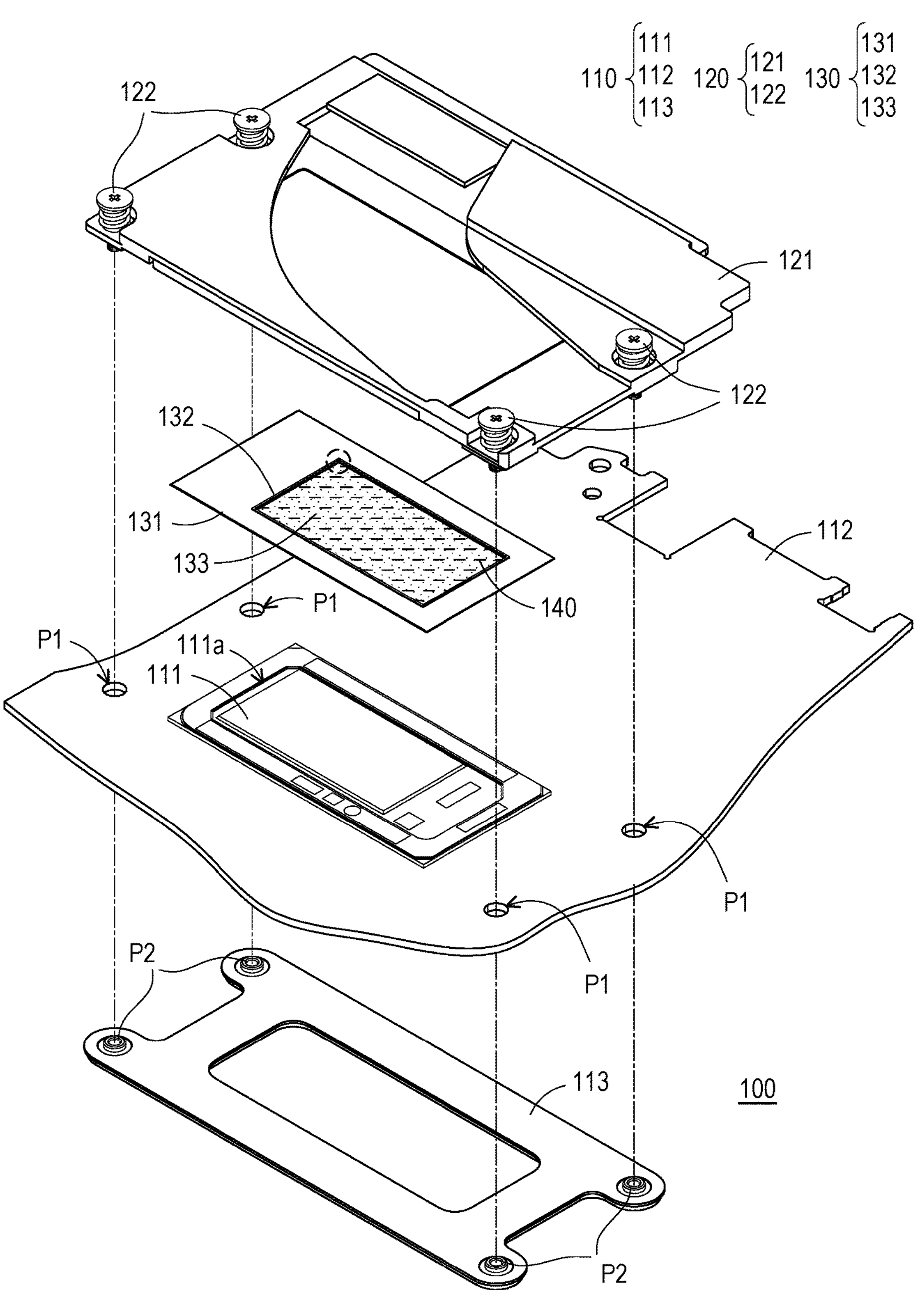
FIG. 1 is an exploded view of an electronic package module according to an embodiment of the disclosure.
Figure 2:
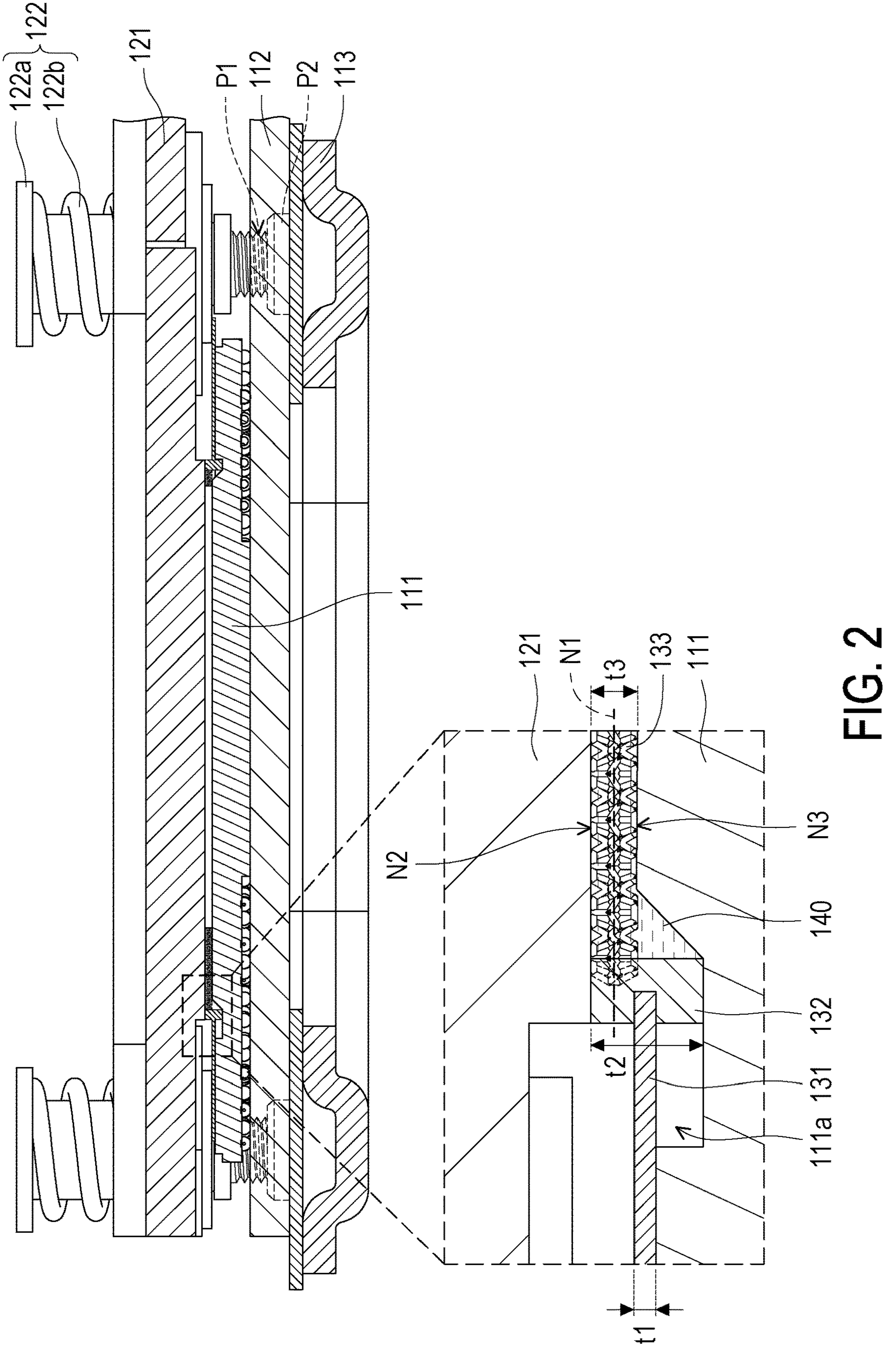
FIG. 2 is a cross-sectional view of the electronic package module in FIG. 1 after assembly.
Figure 3:
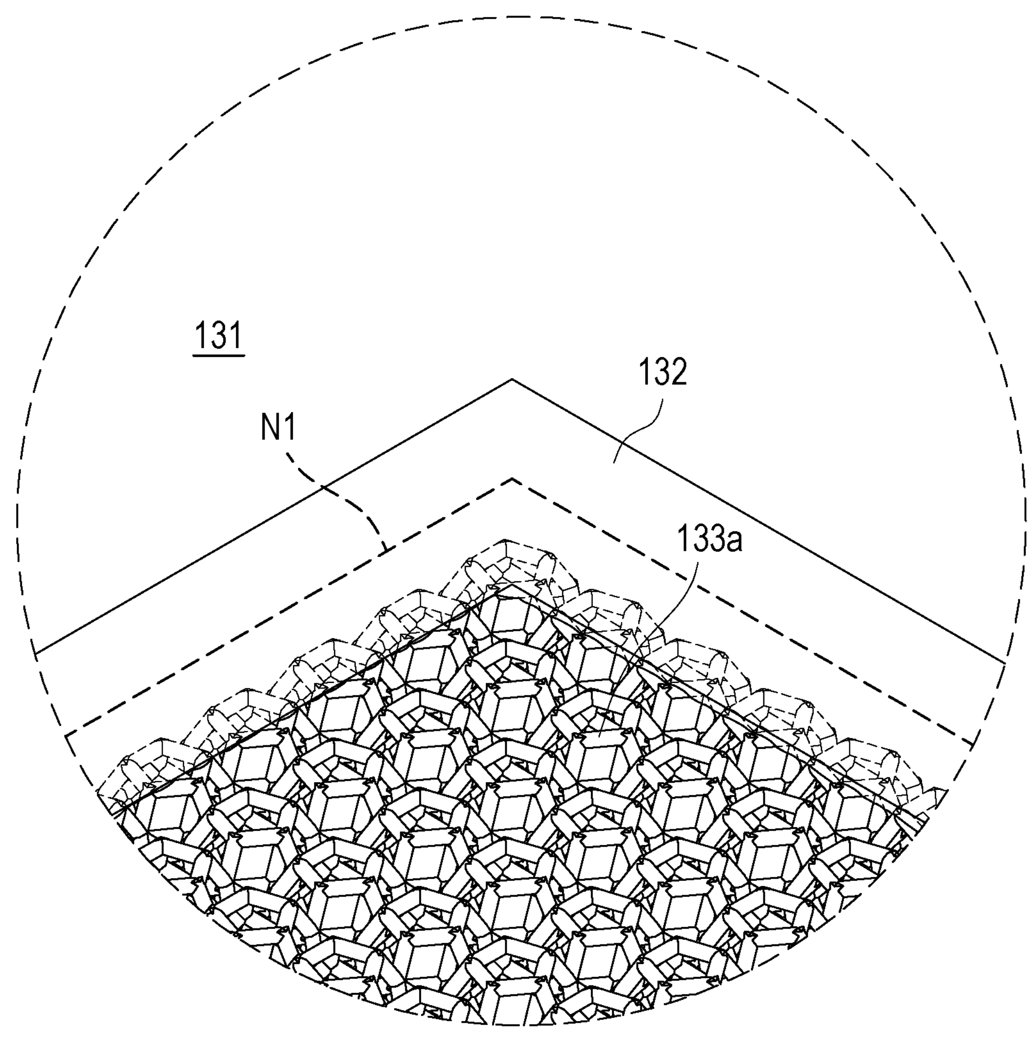
FIG. 3 is a partially enlarged view of the electronic package module in FIG. 1.

FIG. 1 is an exploded view of an electronic package module according to an embodiment of the disclosure. FIG. 2 is a cross-sectional view of the electronic package module in FIG. 1 after assembly. FIG. 3 is a partially enlarged view of the electronic package module in FIG. 1. Please refer to FIG. 1 to FIG. 3 at the same time. In this embodiment, an electronic package module 100 includes a circuit component 110, a heat-dissipation component 120, a carrying member 130, and a liquid metal 140. The circuit component 110 includes a circuit board 112 and a chip 111 disposed thereon, and the chip 111 is, for example, a central processing unit (CPU) or a graphics processing unit (GPU) of a computer system. The carrying member 130 is clamped between the chip 111 and the heat-dissipation component 120. The carrying member 130 has a porous structure. The liquid metal 140 is filled in the porous structure to be in thermal contact with the chip 111 and the heat-dissipation component 120. The liquid metal 140 is constrained between the chip 111 and the heat-dissipation component 120 by the carrying member 130 and does not flow outside of the chip 111 and the heat-dissipation component 120. Moreover, heat-dissipation fins (not illustrated) may further be disposed at an opposite side of the heat-dissipation component 120 facing away from the carrying member 130 or the chip 111, so that the heat generated by the chip 111 may be dissipated out of the electronic package module 100 sequentially through the carrying member 130, the heat-dissipation component 120, and the heat-dissipation fins.

As shown in FIG. 1 and FIG. 2, the circuit component 110 also includes a back board 113 disposed at an opposite side of the circuit board 112 facing away from the chip 111, and the circuit board 112 has a via P1. The back board 113 has a locking protrusion P2, in which the locking protrusion P2 has an internal thread. Correspondingly, the heat-dissipation component 120 includes a body 121 and a plurality of locking members 122, in which the liquid metal 140 is in contact with the body 121, and the carrying member 130 is substantially clamped between the body 121 and the chip 111. The locking member 122 movably disposed on the body 121 includes a locking unit 122*a* and an elastic unit 122*b*. The locking unit 122*a* passes through the body 121 and the circuit board 112 to be locked to the back board 113, which is equivalent to the locking unit 122*a* being locked to the locking protrusion P2 after passing through the via P1 and a locking depth may be adjusted accordingly. The elastic unit 122*b* is sleeved on the locking unit 122*a* and abuts between the locking unit 122*a* and the body 121. In this way, as a depth of the locking unit 122*a* being locked to the locking protrusion P2 increases, it is equivalent to increase a force exerted by the locking unit 122*a* and the body 121 on the elastic unit 122*b*, that is, increasing the deformation of the elastic unit 122*b*. According to this, an elastic force of the elastic unit 122*b* becomes a force abutting and compressing the carrying member 130, so that the chip 111 and the circuit board 112 are firmly clamped between the body 121 of the heat-dissipation component 120 and the back board 113.

In this embodiment, the carrying member 130 includes a metal mesh 133 and a compressible elastic body 132, in which the metal mesh 133 has a porous structure, and the compressible elastic body 132 is disposed surrounding a periphery of the metal mesh 133 and is abutted and compressed between the heat-dissipation component 120 and the chip 111 at the same time. Moreover, the carrying member 130 further includes an outer frame 131 disposed surrounding a periphery of the compressible elastic body 132, and makes the compressible elastic body 132 be positioned between the metal mesh 133 and the outer frame 131. Here, the outer frame 131 is acrylic or a mylar film, and the compressible elastic member 132 is, for example, silicone rubber, which combines the outer frame 131 with the metal mesh 133 through in-mold injection molding of liquid silicone rubber (LSR). Regarding the outer frame 131 and the compressible elastic body 132, the outer frame 131 has a higher hardness compared to the compressible elastic body 132, and the compressible elastic body 132 has a higher elasticity compared to the outer frame 131. At the same time, a thickness t2 of the compressible elastic body 132 is greater than a thickness t3 of the metal mesh 133, and the thickness t2 of the compressible elastic body 132 is greater than a thickness t1 of the outer frame 131. Therefore, when being clamped the by the body 121 of the heat-dissipation component 120 and the back board 113 of the circuit component 110 by the above means, the compressible elastic body 132 is directly clamped and squeezed by the body 121 and the chip 111 structurally, and then a closed space is formed between the heat-dissipation component 120 and the chip 111 to contain the liquid metal 140 and avoid overflowing. It should also be mentioned that the metal mesh 133 may also be compressed between the chip 111 and the body 121 of the heat-dissipation component 120 due to having an elasticity.

Furthermore, as shown in FIG. 1, an outline of the outer frame 131 is consistent with an outline of the chip 111. In other words, since the hardness of the outer frame 131 is higher than the hardness of the compressible elastic body 132, it is easy to be grasped by a user to facilitate positioning and adhering the carrying member 130 on an upper surface of the chip 111. As shown in FIG. 2, a groove 111*a* is disposed surrounding a periphery of the chip 111, and the outer frame 131 may provide a back glue or an adhesive layer on one side thereof, so as to adhere the outer frame 131 to a surface of the chip 111, and at the same time allow the compressible elastic body 132 accurately to fall into the groove 111*a* and align with an inner edge of the groove 111*a*. The liquid metal 140 overflowing from the upper surface of the chip 111 needs to flow into the groove 111*a* first, and at the same time be blocked by the compressible elastic body 132, so there is a double protection effect of preventing the liquid metal 140 from overflowing. When assembling the circuit component 110, the carrying member 130, and the heat-dissipation component 120, the user holds the outer frame 131 of the carrying member 130 as described above to complete the alignment and adherence of the carrying member 130 to the chip 111. Subsequently, the heat-dissipation component 120 may be locked into the back board 113 of the circuit component 110 with the locking member 122, the carrying member 130 may successfully be clamped therein, and the compressible elastic body 132 of the carrying member 130 may be directly abutted and compressed structurally by the body 121 and the chip 111 to jointly form the closed space to contain the liquid metal 140. Accordingly, the carrying member 130 may effectively improve the convenience of the aforementioned construction process.

Next, please refer to FIG. 2 and FIG. 3 again. In this embodiment, a material of the metal mesh 133 is the same as a material of the body 121 of the heat-dissipation component 120, such as copper, so as to facilitate transmitting the heat generated by the chip 111 to the heat-dissipation component 120 without reducing the heat conduction performance thereof. Furthermore, as shown in FIG. 3, the porous structure of the metal mesh 133 comprises a plurality of polygonal hollow structural units 133*a* combined with each other along a planar surface N1, and any two adjacent polygonal hollow structural units 133*a* communicate with each other along the planar surface N1. In terms of production, the metal mesh 133 is completed first, and then the outer frame 131 and the metal mesh 133 are placed in a mold together, and the outer frame 131 is combined with the metal mesh 133 through in-mold injection molding of LSR. At the same time, for these polygonal hollow structural units 133*a* of the metal mesh 133, top surfaces N2 and bottom surfaces N3 are respectively coplanar, so as to facilitate the adherence of the top surfaces N2 to the body 121 or the adherence of the bottom surfaces N3 to the chip 111.

In addition, please refer to FIG. 2 again. For the liquid metal 140, after the compressible elastic body 132 of the carrying member 130 forms the closed space with the body 121 and chip 111, the liquid metal 140 may effectively stopped from overflowing and be constrained in the closed space. In other words, the liquid metal 140 may freely flow in the plurality of polygonal hollow structural units 133*a*, and these polygonal hollow structural units 133*a* may effectively produce a wave-absorbing effect on the liquid metal 140 to reduce the fluidity of the liquid metal 140. At the same time, the liquid metal 140 may be uniformly distributed in these polygonal hollow structural units 133*a*, so that the liquid metal 140 may be stably maintained between and in thermal contact with the body 121 of the heat-dissipation component 120 and the chip 111. In this embodiment, outer diameters of the polygonal hollow structural units 133*a* are respectively smaller than or equal to 0.15 mm. Therefore, these polygonal hollow structural units 133*a* are equivalent to constraining the liquid metal 140 through the capillary action to achieve the effect of stable heat conduction.

In summary, in the above embodiments of the disclosure, the electronic package module effectively constrains the liquid metal between the heat-dissipation component and the chip through the porous structure of the carrying member, so as to maintain the required heat dissipation performance and avoid the short-circuit damage that may be caused by the liquid metal flowing outside of the heat-dissipation component and the chip. Furthermore, the material of the porous structure of the carrying member is the same as the heat-dissipation component, so that the heat conduction performance is not reduced. More importantly, the porous structure of the carrying member produces a capillary-like adsorption effect on the liquid metal, so that the liquid metal may be successfully retained in the space between the heat-dissipation component and the chip without overflowing, while reducing the fluidity of the liquid metal in the space and making the distribution density of the liquid metal in the space uniform. In this way, the liquid metal may stably and continuously transmit the heat generated by the chip to the heat-dissipation component and then dissipate out of the electronic package module, so that the liquid metal may maintain a proper heat dissipation effect.

What is claimed is:

1. An electronic package module, comprising:

a chip;

a heat-dissipation component;

a carrying member clamped between the chip and the heat-dissipation component, wherein the carrying member has a porous structure; and a liquid metal filled in the porous structure to be in thermal contact with the chip and the heat-dissipation component, wherein the liquid metal is constrained between the chip and the heat-dissipation component by the carrying member and does not flow outside of the chip and the heat-dissipation component, wherein the carrying member comprises a metal mesh, a compressible elastic body, and an outer frame, the metal mesh has the porous structure, the compressible elastic body is disposed surrounding a periphery of the metal mesh and compressed between the heat-dissipation component and the chip, and the outer frame is disposed surrounding a periphery of the compressible elastic body, wherein a thickness of the compressible elastic body is greater than a thickness of the metal mesh, and the thickness of the compressible elastic body is greater than a thickness of the outer frame.

2. The electronic package module according to claim 1, wherein the outer frame is an acrylic film or a biaxially oriented polyethylene terephthalate film.

3. The electronic package module according to claim 1, wherein the compressible elastic body combines the outer frame with the metal mesh through in-mold injection molding of liquid silicone rubber (LSR).

4. The electronic package module according to claim 1, wherein an outline of the outer frame is larger than an outline of the chip.

5. The electronic package module according to claim 1, wherein a material of the metal mesh and a material of the heat-dissipation component are respectively copper.

6. The electronic package module according to claim 1, wherein a groove is disposed surrounding a periphery of the chip, and the compressible elastic body is positioned in the groove and is abutted and compressed by the heat-dissipation component.

7. The electronic package module according to claim 1, wherein the porous structure comprises a plurality of polygonal hollow structural units combined with each other along a planar surface, and any two adjacent ones of the polygonal hollow structural units communicate with each other along the planar surface.

8. The electronic package module according to claim 7, wherein top surfaces of the combined polygonal hollow structural units are coplanar, and bottom surfaces of the combined polygonal hollow structural units are coplanar.

9. The electronic package module according to claim 1, further comprising a circuit board and a back board, wherein the chip is disposed on the circuit board, and the circuit board is positioned between the chip and the back board.

10. The electronic package module according to claim 9, wherein the heat-dissipation component comprises a body and a plurality of locking members, the plurality of locking members are movably disposed on the body and locked to the back board through the body and the circuit board, so that the chip, the carrying member, and the circuit board are clamped between the body of the heat-dissipation component and the back board.

11. The electronic package module according to claim 10, wherein the locking member comprises a locking unit and an elastic unit, the locking unit passes through the body and the circuit board to be locked to the back board, and the elastic unit is sleeved on the locking unit and abuts between the locking unit and the body.

* * * * *